United States Patent
Plat et al.

(10) Patent No.: US 6,869,888 B1
(45) Date of Patent: *Mar. 22, 2005

(54) E-BEAM FLOOD EXPOSURE OF SPIN-ON MATERIAL TO ELIMINATE VOIDS IN VIAS

(75) Inventors: Marina V. Plat, San Jose, CA (US); Ramkumar Subramanian, Sunnyvale, CA (US); Christopher F. Lyons, Fremont, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 298 days.

This patent is subject to a terminal disclaimer.

(21) Appl. No.: 09/901,704

(22) Filed: Jul. 11, 2001

(51) Int. Cl.[7] .......................................... H01L 21/3105
(52) U.S. Cl. ..................... 438/725; 438/700; 438/706; 438/710; 438/725
(58) Field of Search ............................ 438/689, 700, 438/706, 710, 725

(56) References Cited

U.S. PATENT DOCUMENTS

| | | | | |
|---|---|---|---|---|
| 4,663,832 A | * | 5/1987 | Jambotkar ................. 438/437 |
| 5,468,595 A | * | 11/1995 | Livesay ..................... 430/296 |
| 5,965,461 A | | 10/1999 | Yang et al. ................. 438/717 |
| 5,985,516 A | * | 11/1999 | Shy ........................... 430/296 |
| 6,060,386 A | * | 5/2000 | Givens ....................... 438/626 |
| 6,204,117 B1 | * | 3/2001 | Chiou et al. ................ 438/253 |
| 6,287,955 B1 | * | 9/2001 | Wang et al. ................ 438/623 |
| 6,436,810 B1 | * | 8/2002 | Kumar et al. .............. 438/633 |
| 2002/0130416 A1 | * | 9/2002 | Wang et al. ................ 257/758 |

* cited by examiner

*Primary Examiner*—Anita Alanko
(74) *Attorney, Agent, or Firm*—Foley & Lardner LLP

(57) ABSTRACT

A method for forming a semiconductor device is described. The method comprises forming a first layer over a semiconductor substrate. At least one hole is formed through the first layer. A bottom anti-reflective coating (BARC) layer is formed in the at least one hole. The BARC layer is exposed to an electron beam (e-beam) so that the BARC layer reaches a flow temperature in the at least one hole. An etch is performed to form a trench in the first layer and over the at least one hole, wherein the BARC layer in the at least one hole acts as an etch resistant layer during the etch.

21 Claims, 5 Drawing Sheets

E-BEAM FLOOD EXPOSURE OF SPIN-ON MATERIAL TO ELIMINATE VOIDS IN VIAS

CROSS-REFERENCE TO RELATED APPLICATIONS

This application is related to the following applications:
1. U.S. application Ser. No. 09/901,702 entitled "MEASURING BARC THICKNESS USING SCATTEROMETRY", now U.S. Pat. No. 6,558,965.
2. U.S. application Ser. No. 09/901,701 entitled "E-BEAM SENSITIVE MATERIAL TO CONTROL VIA FILL DEPTH" now abandoned.
3. U.S. application Ser. No. 09/901,699 entitled "DUAL BAKE FOR BARC FILL WITHOUT VOIDS", now U.S. Pat. No. 6,605,546.

BACKGROUND OF THE INVENTION

1. Field of the Invention

This invention relates generally to the elimination of possible voiding of etch resistant material in vias in semiconductor device fabrication. In particular, this invention relates to the elimination of voiding of spin-on bottom anti-reflection coating (BARC) material in vias using electron beam (e-beam) flood exposure in semiconductor device fabrication.

2. Description of the Related Art

In certain processes of making semiconductor devices, a via or hole is etched through an insulating dielectric layer to expose an underlying layer, and the insulating dielectric layer is then etched again to form a wider trench above the via or contact hole. For example, in a typical dual damascene process, via holes and overlying trenches connecting the via holes are formed in an inter-level dielectric (ILD). The trench and vias are then filled with a conductive material that connects to underlying conducting material on the device through the via holes. The via hole is first etched in a hole formation etch, and then exposed to a second etch in the trench formation etch. In this case, the second etch exposes any layer exposed by the hole to the etchant in the second etch.

SUMMARY OF THE INVENTION

According to an embodiment of the present invention there is provided a method for forming a semiconductor device. The method comprises forming a first layer over a semiconductor substrate. At least one hole is formed through the first layer. A bottom anti-reflective coating (BARC) layer is formed in the at least one hole. The BARC layer is exposed to an electron beam (e-beam) so that the BARC layer reaches a flow temperature in the at least one hole and flows. An etch is performed to form a trench in the first layer and over the at least one hole, wherein the BARC layer in the at least one hole acts as an etch resistant layer during the etch.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENTS

Figure 1A:
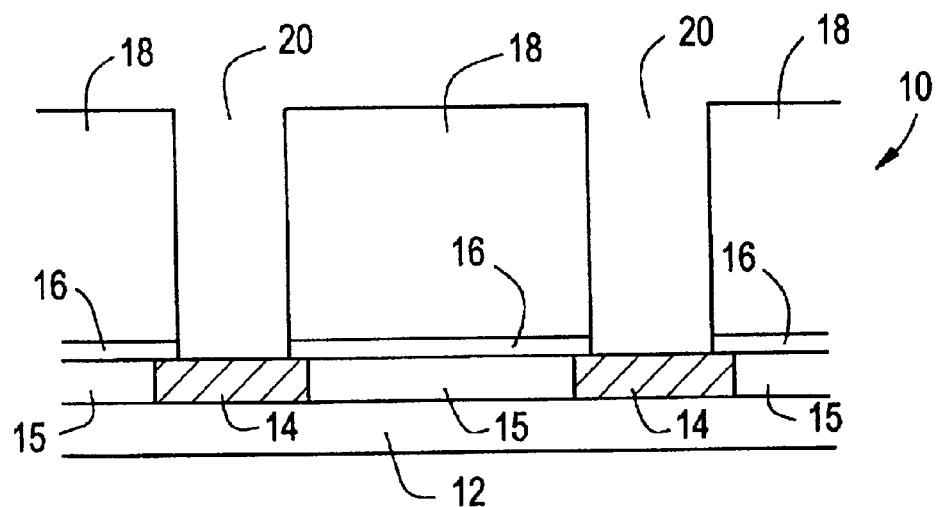
FIGS. 1A–1G illustrate cross-sectional views of the structure of a semiconductor device according to an embodiment of a process of the present invention.

FIG. 1A shows a structure formed in the first steps of a process in an embodiment of the invention of forming a semiconductor device 10. In FIG. 1A, the semiconductor device 10 includes a semiconductor substrate 12. The substrate may comprise, for example, a IV-IV material such as silicon, germanium, or an alloy of silicon and germanium. The substrate may alternatively comprise a III-V material such as GaAs, AlAs, etc. or a II-VI material such as CdS etc.

A conducting layer 14 is formed over the semiconductor substrate 12. The conducting layer 14 may be a patterned wiring layer comprising a conducting material, as is known in the art. The conducting layer may comprise, for example, a doped semiconductor material or a metal. Suitable metals include copper, tungsten, aluminum, and alloys thereof. The conducting layer 14 may also comprise a silicide such as a refractory metal silicide. Suitable refractory metal silicides include titanium silicide, tungsten silicide, nickel silicide, and cobalt silicide.

The conducting layer 14 may be formed by any suitable process, such as chemical vapor deposition (CVD), plasma enhanced chemical vapor deposition (PECVD), plating, or sputtering.

The conducting layer 14 may be formed, for example, by blanket deposition of conducting material followed by either etch-back or polishing to remove undesired conducting material. Alternatively, the conducting layer 14 may be formed by selective deposition of conducting material. If the conducting layer 14 is formed by selective deposition, it may be desirable to first form a lining material that acts as an adhesion promoter or nucleation material.

Although the conducting layer 14 is shown in FIG. 1A to be an interconnect, the conducting layer 14 may alternatively be a region of the semiconductor substrate 12, such as a doped region of the substrate 12. The conducting layer 14 may be, for example, a p-type or n-type region of the semiconductor substrate 12.

An ILD layer 15 is formed between regions of conducting layer 14 as shown in FIG. 1A. The ILD layer 15 may be, for example, a low-k dielectric to reduce capacitance between conducting regions of the semiconductor device 10 shown in FIG. 1A. By reducing the capacitance between conducting regions, the low-k dielectric reduces the interline capacitance, thereby reducing the RC delay, cross-talk noise and power dissipation in the interconnects. In this application low-k dielectric means a dielectric with a dielectric constant of less than about 4. Suitable low-k dielectrics are, for example, benzocyclobutene (BCB), hydrogen silsequioxane (HSQ), FLARE, which is a commercially known material manufactured by Allied Signal, and SILK.

After the conducting layer 14 and ILD layer 15 are formed, a cap layer 16 may optionally be formed to protect the conducting layer 14 by acting as a barrier layer. The cap layer 16 may also be chosen to act as an adhesion promoter for subsequent layers to be formed on the cap layer 16. The cap layer 16 may be, for example, silicon nitride (SiN) when the first conducting layer is copper. The silicon nitride may be deposited, for example, by chemical vapor deposition (CVD). If the first conducting layer is aluminum, the cap layer 16 may be SiN or $SiO_2$.

After the conducting layer 14 is formed, a first layer 18 is formed over the semiconductor substrate 12 and the conducting layer 14, and the ILD 15 (and optional cap layer 16 if used). The first layer 18 may be an insulating layer to provide insulation between different levels of conductive wiring.

The first layer 18 may be an ILD. The first layer 18, like the ILD 15, may be, for example, a low-k dielectric to reduce capacitance between conducting regions of the semiconductor device 10 shown in FIG. 1A.

After the first layer 18 has been formed, holes 20, such as via or contact holes, are formed in the first layer 18 in a first etching. While FIG. 1A shows two holes, a single hole or more than two holes may be formed. The holes 20 may be formed by known techniques, such as forming an etch mask on the first layer 18, dry etching to form the holes 20, and subsequently removing the etch mask. The dry etching may be reactive ion etching (RIE), for example.

The holes 20 shown in FIG. 1A expose the conducting layer 14. Thus, the first etching may include etching through the cap layer 16, if a cap layer is present. Alternatively, the holes 20 may be formed such that they do not expose the conducting layer 14 in the first etching, but expose the conducting layer 14 only upon a subsequent etching after a trench over the holes is formed. The trench etching process is described later.

Figure 1B:
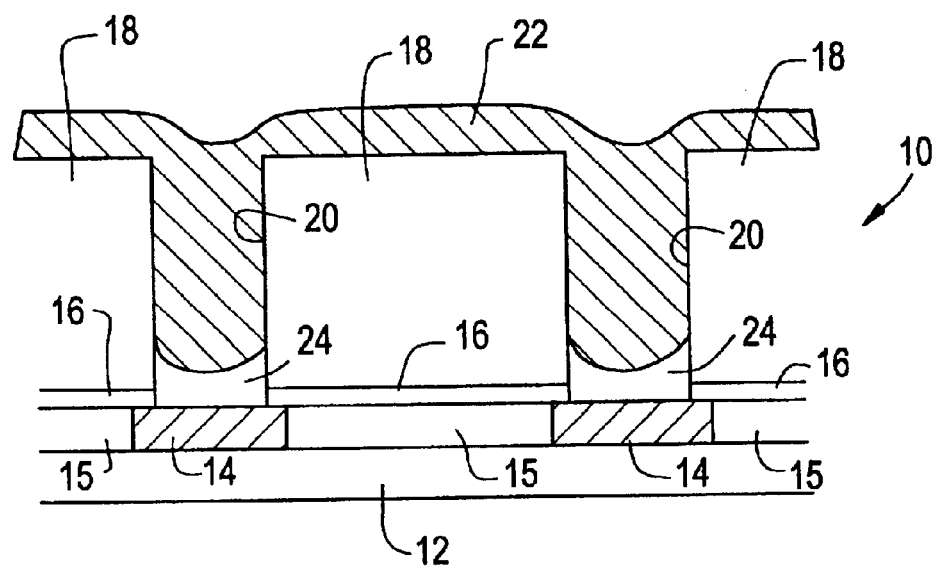

As shown in FIG. 1B, after the holes 20 are formed in the first etching, a bottom anti-reflective coating (BARC) layer 22 is formed filling the holes 20. It should be noted that although BARC layer 22 has anti-reflective properties, the BARC layer 22 need not be actually used as an anti-reflective coating in subsequent processing. However, the BARC layer 22 should have etch resistant properties in the subsequent trench etch, described later. The BARC layer 22 is preferably a conventional spin-on organic material, such as, for example, polyimides, polysulfones, and/or the like, that forms a thin film. Specifically, the BARC may be, for example, KrF17b from AZ-CLARIANT or AR7 made by Shipley. Organic materials such as these and techniques for applying them in thin films are well known to those skilled in the art.

The BARC layer 22 may be formed by a spinning on process as is known in the art. A BARC solution is first spun on over the first layer 18, and then a soft bake is performed to drive off the BARC solution leaving the BARC layer 22. When the BARC layer 22 is formed on the first layer 18, the BARC layer 22 is also formed in the holes 20. It is possible, however, that the process of forming the BARC layer 22 causes voids 24 to be formed in the holes 20, such that the BARC layer 22 does not completely fill the holes 20.

Because there is a possibility of voids being formed in the holes 20 during the formation of the BARC layer 22, the BARC layer 22 should be heated such that the BARC layer reaches a flow temperature. When a flow temperature is reached the BARC layer 22 will flow filling the voids 24.

Figure 1C:
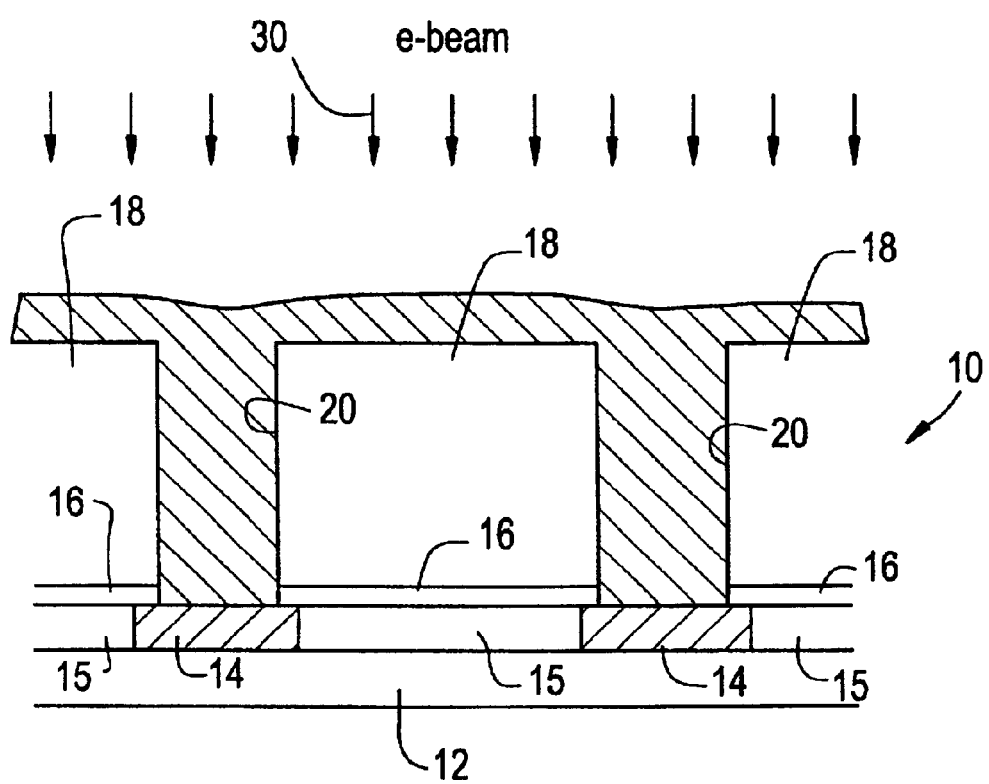

FIG. 1C shows exposing the BARC layer 22 to an e-beam 30 to heat the BARC layer 22 to a flow temperature and fill any potential voids 24 in the holes 20. In general, the flow temperature will be the glass transition temperature, Tg, of the BARC layer 22. In this regard, the e-beam should have sufficient energy to cause the temperature of the BARC layer 22 to rise above the flow temperature of the BARC. Beneficially, heating the BARC layer 22 above the flow temperature by e-beam exposure also planarizes the BARC layer 22.

The exposure of the BARC layer 22 to an e-beam is preferably accomplished in a flood exposure, i.e., the entire top surface of the BARC layer 22 is exposed. Alternatively, and less preferably different regions of the BARC layer 22 may be exposed at different times. In any case, the entire BARC layer 22 is exposed during the e-beam exposure.

Figure 1D:
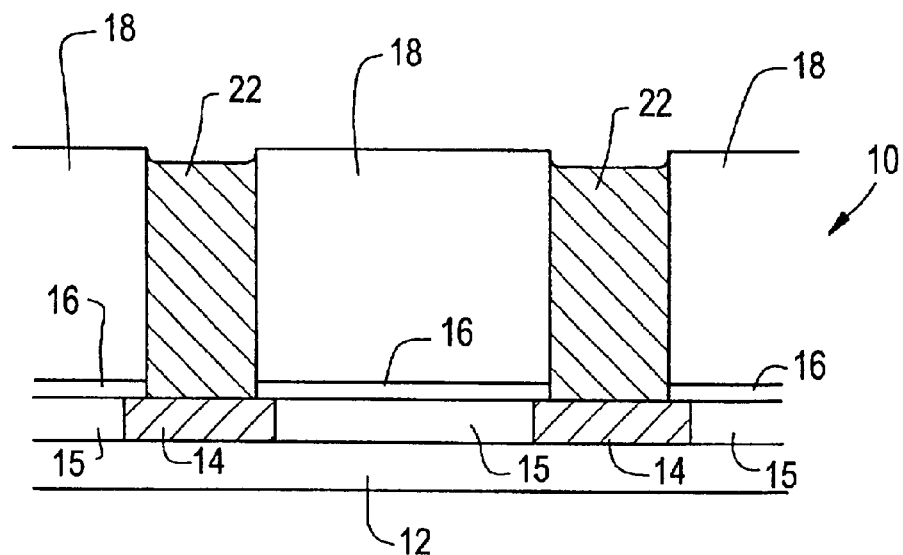

FIG. 1D shows an optional step where a top portion of the BARC layer 22 is removed. Specifically, the top portion of the BARC layer 22 that is on top of the first layer 18 may be substantially removed, if desired, so that the BARC layer 22 does not inhibit formation of a trench in further processing, described later. For example, the top portion may be substantially removed to substantially expose the top of the first layer 18 by an etch back process, or polishing. The etch back process may be an ashing step where the BARC layer 22 is exposed to oxygen for a time sufficient to substantially remove the top portion of the BARC layer 22. The polishing may be chemical mechanical polishing, for example. FIG. 1D shows the BARC layer 22 with the top portion removed.

In FIG. 1D the BARC layer 22 is slightly recessed relative to the top of the first layer 18. Alternatively, the BARC layer 22 may extend slightly above the first layer or be level with the top of the first layer.

Figure 1E:
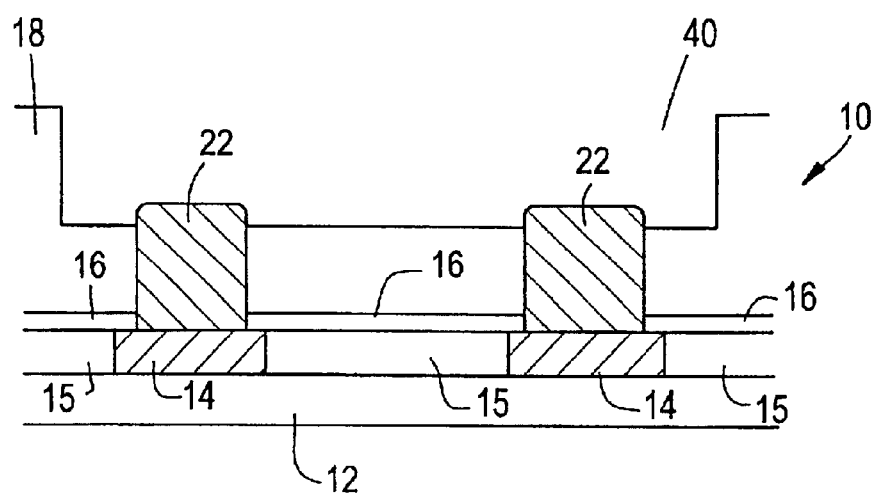

FIG. 1E illustrates the process of forming a trench 40 over the BARC filled holes 20. The trench 40 is formed by etching the first layer 18 over the BARC filled holes 20. The etching to form the trench 40 may be performed using a dry etch, such as a plasma etch or reactive ion etching (RIE). A resist mask (not shown) with the trench pattern is formed over first layer 18, and the trench is etched through the mask as is known in the art.

Beneficially, the BARC layer 22 that remains in the holes 20 acts as an etch resistant material during the etch of the trench 40. Thus, the underlying conducting layer 14 is protected during the etch of the trench 40.

FIG. 1E shows the remaining BARC layer 22 extending outside the holes 20 after the trench etch. However, the remaining BARC layer 22 need not extend out of the holes to provide etch protection for the underlying conducting layer 14. In fact, there may be little or no BARC layer 22 remaining after the trench etch. It is preferred, however, that at least a portion of the BARC layer 22 remain in the hole at least during most of the trench etch to protect the underlying conducting layer 14.

FIG. 1E shows the trench 40 etched such that the BARC filled holes 20 are connected by the trench 40. Alternatively, the holes 20 may not be connected by the trench 40.

Figure 2:
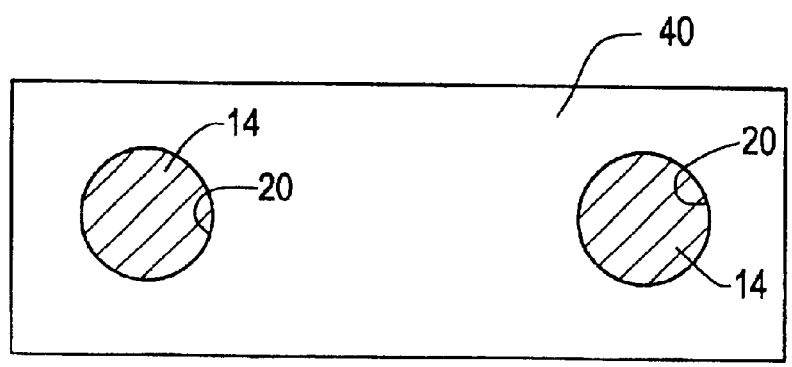
FIG. 2 is a top view of the structure of FIG. 1E.

FIG. 2 shows a top view of the trench 40 and the holes 20 of the structure of FIG. 1E. The trench 40 is seen to have a rectangular cross-section. Alternatively, the trench 40 may have other than a rectangular cross-section. For example, the trench 40 may have a circular cross-section where the axis of the trench 40 is co-linear with the axis of one of the holes 20 and may or may not extend to the other hole. Thus, the trench 40 may be simply a wider hole above one of the holes 20.

Figure 1F:
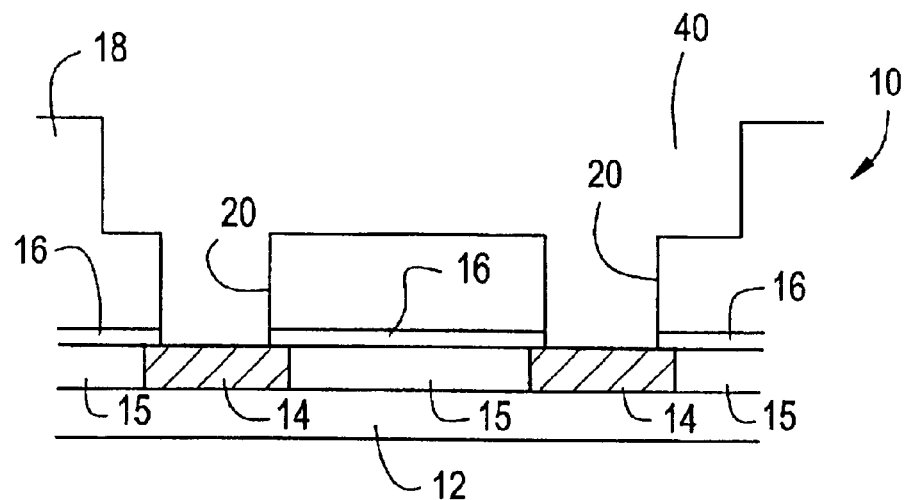

As shown in FIG. 1F, after the trench 40 is formed, the portion of the BARC 22 that remains is removed to expose the underlying conducting layer 14. The remaining BARC layer 22 may be removed, for example, by ashing the BARC through exposure to an oxygen plasma, or by exposing the BARC 22 to a wet stripping solution. Once the remaining portion of the resist is removed, further processing continues.

Figure 1G:
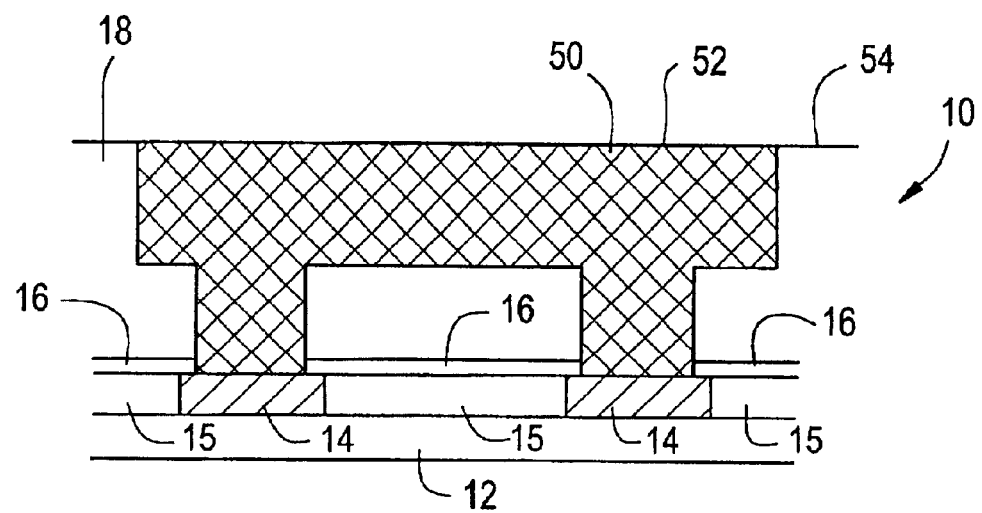

As shown in FIG. 1G, after the BARC layer 22 is removed, a second conducting layer 50 may be formed in the trench 40 and holes 20 to connect to the conducting layer 14. The second conducting layer 50 may be formed, for example, by blanket depositing a second conducting material over the substrate 12 and in the trench 40 and holes 20, followed by removing a top portion of the second conducting layer 50 until a top surface 52 of the second conducting layer 50 is substantially at a same height as a top surface 54 of the first layer 18. The top portion of the second conducting layer 50 may be removed, for example, by etching back or polishing the second conducting layer 50. The polishing of the second conducting layer 50 may be performed by chemical mechanical polishing, for example.

Although the process illustrated in FIGS. 1A–1G is a dual damascene process, the present invention is not so limited.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method of forming a semiconductor device comprising:
    forming a first layer over a semiconductor substrate;
    forming at least one hole through the first layer;
    forming a bottom anti-reflective coating (BARC) layer in the at least one hole;
    exposing the BARC layer to an electron beam (e-beam) so that the BARC layer reaches a flow temperature in the at least one hole and flows, wherein the exposure step is a flood e-beam exposure step such that an entire top layer of the BARC layer is exposed; and
    performing an etch to form a trench in the first layer and over the at least one hole, wherein the BARC layer in the at least one hole acts as an etch resistant layer during the etch.

2. The method of claim 1, wherein the first layer is an interlevel dielectric layer (ILD).

3. The method of claim 2, wherein the ILD is a low-k dielectric layer.

4. The method of claim 3, wherein the ILD is one of benzocyclobutene (BCB), or hydrogen silsequioxane (HSQ).

5. The method of claim 1, wherein said etch is a second etch and the step of forming at least one hole comprises a first etch that exposes a conducting layer.

6. The method of claim 5, wherein the first etching step etches through a cap layer between the conducting layer and the first layer.

7. The method of claim 6, wherein the cap layer is one of $SiO_2$ and SiN.

8. The method of claim 5, wherein the conducting layer comprises one of an aluminum layer, an aluminum alloy layer, a tungsten layer, a tungsten alloy layer, a copper layer, a copper alloy layer, or a doped semiconductor layer.

9. The method of claim 8, wherein the conducting layer comprises a copper layer.

10. The method of claim 1, wherein the exposing step is performed to flow said BARC layer so as to eliminate voids in said at least one hole.

11. The method of claim 1, wherein the BARC layer is an organic material.

12. The method of claim 1, wherein the at least one hole comprises a first hole and a second hole, and the trench connects the first hole to the second hole.

13. The method of claim 12, wherein the method comprises a dual damascene process.

14. The method of claim 1, wherein the at least one hole comprises a first hole, the trench and the first hole have a substantially circular cross section, and an axis of the trench is co-linear with an axis of the first hole.

15. The method of claim 5, wherein the first and second etches are dry etches.

16. The method of claim 1, wherein the step of forming the BARC layer forms the BARC layer over the first layer, and further comprising:
    substantially removing the BARC layer from a top of the first layer after the exposing step by one of polishing and etching back the BARC layer.

17. The method of claim 5, further comprising:
    removing the BARC layer from the at least one hole after the second etch step.

18. The method of claim 17, wherein the removing step is performed by dry etching the BARC layer in the at least one hole.

19. The method of claim 18, wherein the dry etching ashes the BARC layer in an oxygen atmosphere.

20. The method of claim 17, further comprising:
    forming a conducting layer in the trench and the at least one hole after the removing step.

21. A method of forming a semiconductor device comprising:
    forming a first layer over a semiconductor substrate;
    forming at least one hole through the first layer;
    forming a bottom anti-reflective coating (BARC) layer in the at least one hole, the BARC layer including a void in the at least one hole;
    exposing the BARC layer to an electron beam (e-beam) so that the BARC layer reaches a flow temperature in the at least one hole and flows to fill the void in the at least one hole, wherein the exposure step is a flood e-beam exposure step; and
    performing an etch to form a trench in the first layer and over the at least one hole, wherein the BARC layer in the at least one hole acts as an etch resistant layer during the etch.

* * * * *